United States Patent [19]
Saito et al.

[11] Patent Number: 5,424,594
[45] Date of Patent: Jun. 13, 1995

[54] VEHICLE ALTERNATOR OUTPUT RECTIFIER INSTRUMENT CAPABLE OF HIGH TEMPERATURE OPERATION

[75] Inventors: Akihiro Saito; Keiichi Mashino; Yoshiaki Honda, all of Katsuta; Yuuji Maeda, Hitachiota; Kazutoyo Narita, Hitachi, all of Japan

[73] Assignee: Hitachi, Ltd., Japan

[21] Appl. No.: 4,235

[22] Filed: Jan. 14, 1993

[30] Foreign Application Priority Data

Jan. 14, 1992 [JP] Japan .................................. 4-004984

[51] Int. Cl.$^6$ ........................................... H02K 11/00
[52] U.S. Cl. .................................................. 310/68 D
[58] Field of Search ............. 310/68 D, 68 R; 322/28; 320/29, 28, 57

[56] References Cited

U.S. PATENT DOCUMENTS

| | | | |
|---|---|---|---|
| 3,697,829 | 10/1972 | Huth et al. ...................... | 317/235 R |
| 4,007,104 | 2/1977 | Summers et al. .................... | 204/192 |
| 4,232,238 | 11/1980 | Saito et al. ............................ | 310/68 |
| 4,275,344 | 6/1981 | Mori et al. ............................ | 322/28 |
| 4,450,467 | 5/1984 | Nagano et al. ....................... | 357/38 |
| 4,604,538 | 8/1986 | Merrill et al. ........................ | 310/68 |
| 4,720,734 | 1/1988 | Amemiya et al. ..................... | 357/15 |

FOREIGN PATENT DOCUMENTS 54-5083  3/1979  Japan .
63-240336 10/1988 Japan .

OTHER PUBLICATIONS

Meyers, Enzyklopädisches Lexikon, vol. 16, p. 96, Inst. Mannheim 1976.

Primary Examiner—R. Skudy
Assistant Examiner—E. To
Attorney, Agent, or Firm—Evenson, McKeown, Edwards & Lenahan

[57] ABSTRACT

A vehicle alternator output rectifier instrument in which mesa structure Zener diodes, formed by diffusion of impurity on a P-type silicon substrate, are used as rectifier elements which are used in rectifier circuits for rectifying an alternate current output of a vehicle alternator. Since the vehicle alternator output rectifier instrument employs the above Zener diodes, this rectifier instrument can endure high temperature circumstances, considerably reduce a reverse leakage current to thereby prevent a battery voltage from being discharged and reduce a radio noise to thereby reduce a bad influence exerted upon an electronic device serving as a load.

4 Claims, 8 Drawing Sheets

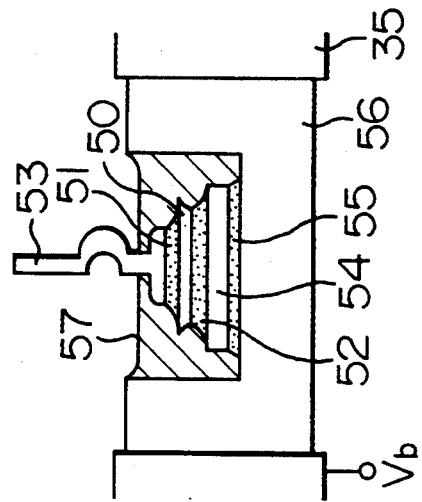
FIG. 6
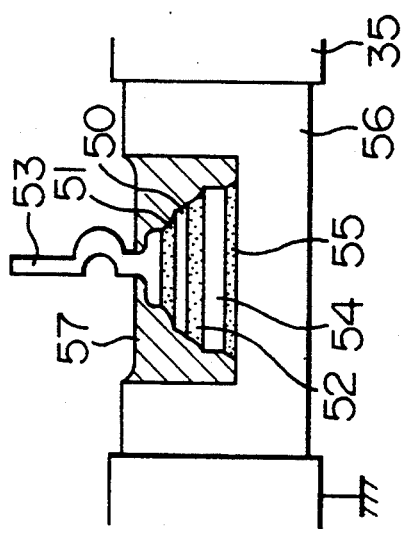
FIG. 8
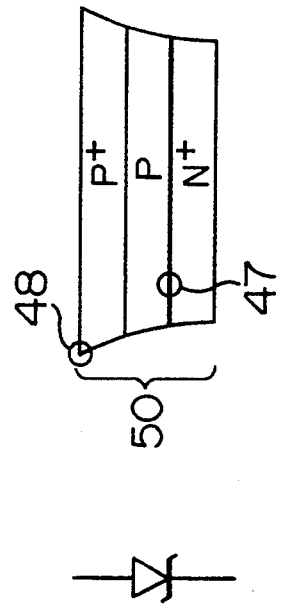
FIG. 7A
FIG. 7B
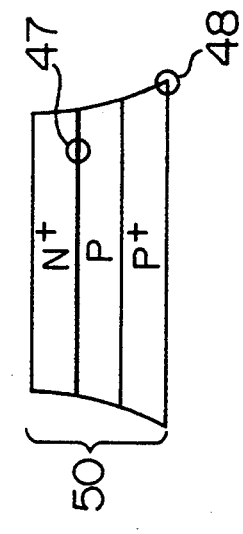
FIG. 9A
FIG. 9B

FIG. 13
| ITEM | AVALANCHE DIODE | IVENTIVE ZENER DIODE |
|---|---|---|
| WITHSTAND VOLTAGE | AVALANCHE BREAKDOWN 300V | ZENER BREAKDOWN 30V |
| CRYSTAL RESISTIVITY | N-TYPE 10 Ω·cm | P-TYPE 0.055 Ω·cm |
| IMPURITY CONCENTRATION | $5 \times 10^{14}\ cm^{-3}$ | $1 \times 10^{18}\ cm^{-3}$ |
| REVERSE RECOVERY TIME | 3.8 μs | 1.0 μs |
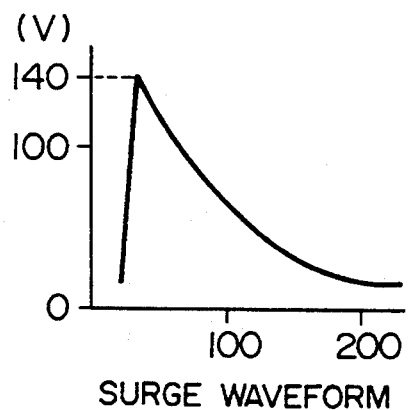
FIG. 14
PRIOR ART
SURGE WAVEFORM
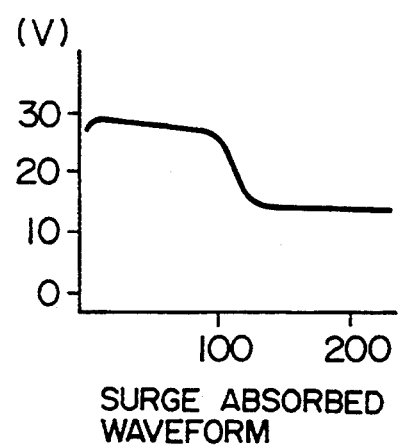
FIG. 15
SURGE ABSORBED WAVEFORM

FIG. 16
PRIOR ART
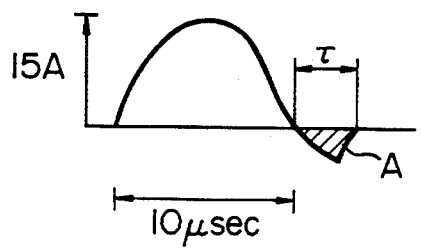
FIG. 17
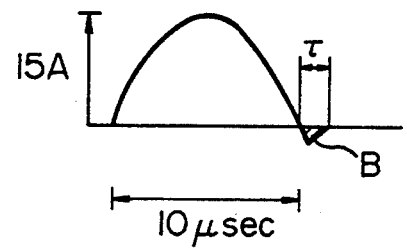
FIG. 18
| PASSIVATION / SILICON / ITEM | MESA STRUCTURE | | PLANAR STRUCTURE | |
|---|---|---|---|---|
| | P-TYPE | N-TYPE | P-TYPE | N-TYPE |
| (1) COOLING OF RECTIFIER ELEMENTS | ○ 120°C | ○ 120°C | × 100°C | × 100°C |
| (2) ZENER CHARACTERISTIC (REVERSE LEAKAGE CURRENT) | ○ | × | △ | △ |
| (3) RADIO NOISE | ○ (Trr=1μs) | △ (Trr=2μs) | ○ (Trr=1μs) | △ (Trr=2μs) |

VEHICLE ALTERNATOR OUTPUT RECTIFIER INSTRUMENT CAPABLE OF HIGH TEMPERATURE OPERATION

BACKGROUND OF THE INVENTION

The present invention generally relates to rectifier instruments for rectifying an output generated from an alternator for vehicles such as a car or the like and, more particularly, is directed to a vehicle alternator output rectifier instrument suitable for suppressing an over-voltage and for reducing a radio noise.

Recently, the kind of and the number of electronic devices that are mounted on vehicles as electrical loads have increased so remarkably that a malfunction of these electronic devices becomes a problem. To avoid the malfunction of the electronic devices, a DC (direct current) voltage that is obtained from a rectifier when the rectifier rectifies an output of an alternator driven by a car engine, must be prevented from generating an over-voltage.

In order to protect the electronic devices from the over-voltage, a conventional vehicle alternator output rectifier instrument employs as rectifier elements Zener diodes which cause a breakdown at a relatively low voltage as is disclosed in Japanese Published Patent Publication Nos. JP-2B-54-5083 and JP-A-63-240336.

When the Zener diodes are mounted on the car, the following points should be considered.

(1) Because the vehicle alternator output rectifier instrument is mounted in the engine room of the car, it is exposed to high temperature and utilized under severe temperature circumstances.

(2) Because the vehicle alternator output rectifier instrument is constantly connected to a car battery even when the car is not driven, a reverse leakage current is generated through the rectifier elements within the rectifier instrument, resulting in the car battery being discharged.

(3) A radio noise generated from the vehicle alternator output rectifier instrument has to be suppressed.

SUMMARY OF THE INVENTION

It is an object of the present invention to provide a vehicle alternator output rectifier instrument using Zener diodes which can be adapted to high temperature circumstances like the engine room of the car.

Another object of the present invention is to provide a vehicle alternator output rectifier instrument which can be adapted to high temperature circumstances like the engine room of the car and which can reduce a reverse leakage current and a radio noise.

According to an aspect of the present invention, in order that the rectifier instrument can be adapted to high temperature circumstances, mesa structure Zener diodes that can realize heat radiation effect by heat conduction are employed as rectifier elements used in the rectifier instrument.

According to another aspect of the present invention, by using P-type substrate Zener diodes, a satisfactory Zener characteristic can be obtained to reduce a reverse leakage current. Also, since the P-type substrate Zener diodes have a small resistivity, a reverse recovery time can be reduced to thereby make it possible to reduce a radio noise.

BRIEF DESCRIPTION OF THE DRAWINGS

A better understanding of other objects, features, and advantages of the present invention can be gained from a consideration of the following detailed description of illustrative embodiments thereof, in conjunction with the figures of the accompanying drawings, in which:

FIG. 6 through 9B are cross-sectional views showing structures of Zener diodes according to the present invention, respectively;

FIG. 13 is a table showing compared results of the inventive Zener diode and the conventional avalanche diode, and to which references will be made in explaining the present invention;

FIG. 14 is a graph showing a waveform of a surge current obtained when the avalanche diode is used;

FIG. 15 is a graph showing a surge characteristic of a rectifier circuit that employs the inventive Zener diode;

FIG. 16 is a diagram showing a reverse recovery time obtained when the conventional avalanche diode is used;

FIG. 17 is a diagram showing a reverse recovery time obtained when the inventive Zener diode is used; and FIG. 18 is a diagram showing technical effects achieved by the present invention in the form of a table.

DESCRIPTION OF THE PREFERRED EMBODIMENTS

The present invention will hereinafter be described in detail with reference to the drawings.

Figure 1:
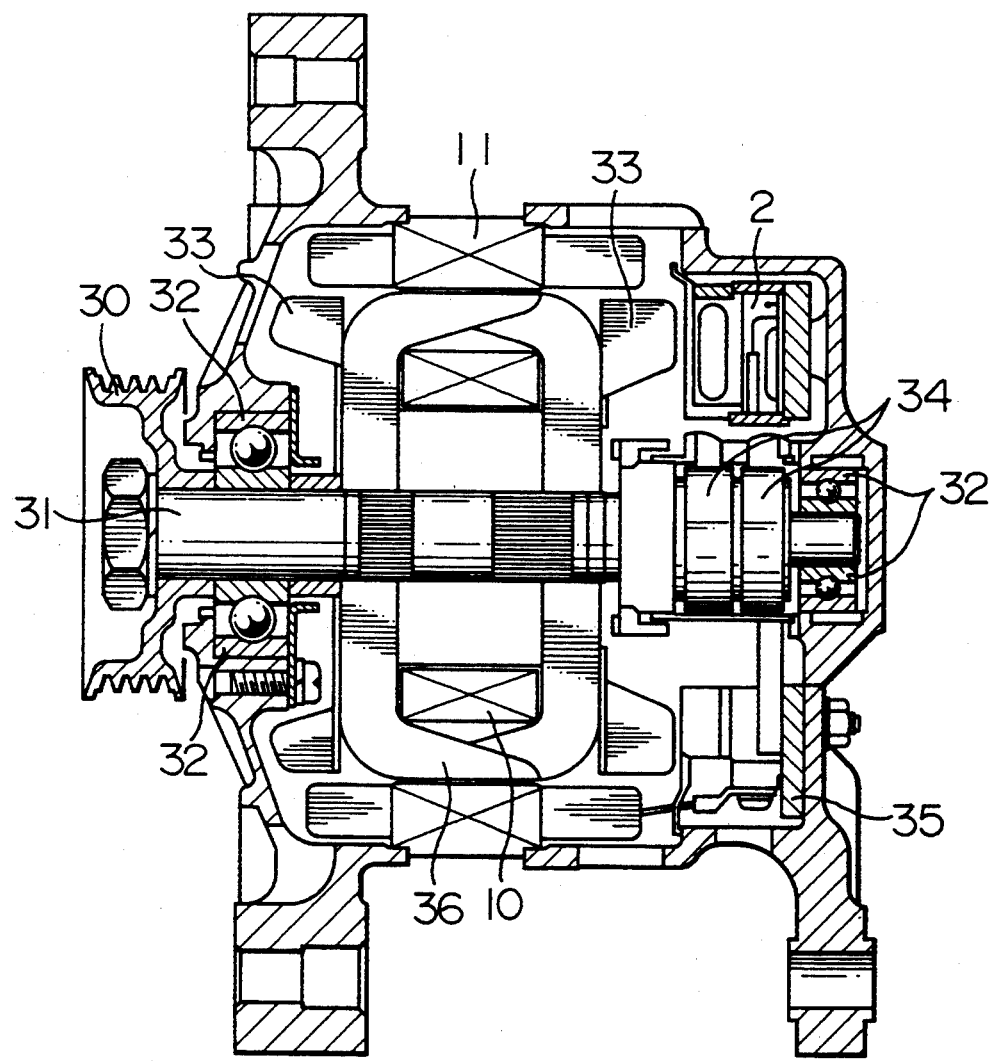
FIG. 1 is a cross-sectional view showing a vehicle alternator according to the present invention.

FIG. 1 of the accompanying drawings shows a cross-sectional view of a vehicle alternator. Referring to FIG. 1, a turning force of a car engine is transmitted through a belt (not shown) to a pulley 30 to rotate a shaft 31 which is supported by bearings 32 so as to become freely rotatable. An exciting winding 10 is attached to a rotor 36 which is rotated in unison with the above shaft 31. A magnetic field generated from the exciting winding 10 and an armature winding 11 on the stator side of the vehicle alternator are interlinked to generate an alternating current (AC) in the armature winding 11. A DC (direct current) output current from a rectifier circuit, which will be below described, is supplied to the exciting winding 10 through slip rings 34.

Figure 2:
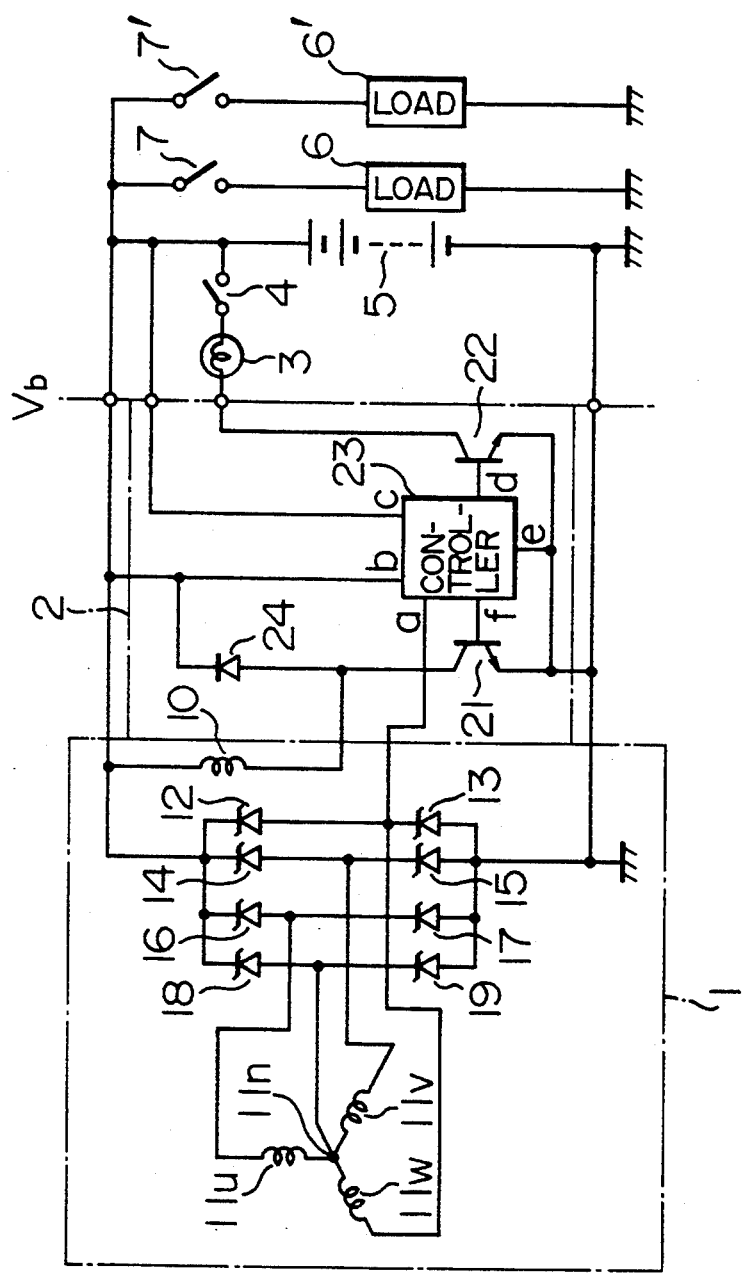
FIG. 2 is an electric circuit diagram showing an example of a circuit provided on the output side of the vehicle alternator shown in FIG. 1.

FIG. 2 of the accompanying drawings is an electric circuit diagram showing an overall circuit arrangement of the output side of the vehicle alternator shown in FIG. 1. As shown in FIG. 2, there is provided a one-dot chain line block 1 which includes a three-phase alternator and a rectifier circuit for rectifying an output of the three-phase alternator. Armature windings 11u, 11v and 11w are connected in a Y-connection fashion. Output ends of the respective armature windings 11u, 11v and 11w and a neutral point 11n among the armature windings 11u, 11v and 11w are respectively connected to Zener diodes 12 through 19 so as to constitute a full wave rectifier circuit. An output terminal of the rectifier circuit 1 is connected to the exciting winding 10 and then is connected to a succeeding circuit which will be described later on.

Figure 3:
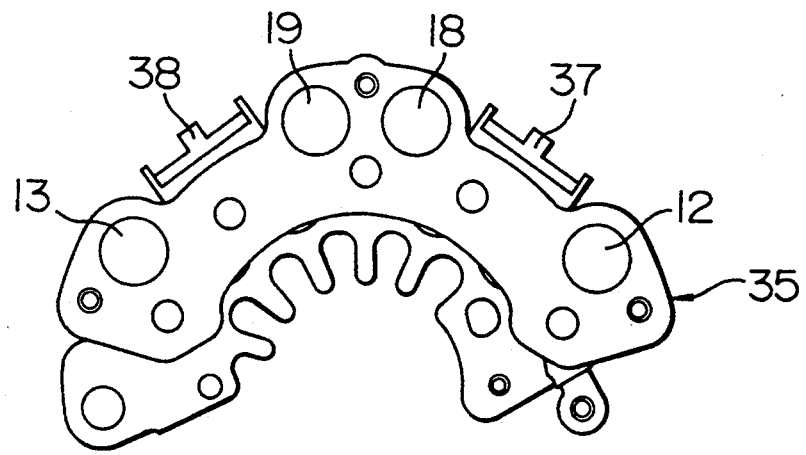
FIG. 3 is a front view showing a cooling plate to which the Zener diodes shown in FIG. 1 are attached.
Figure 4:
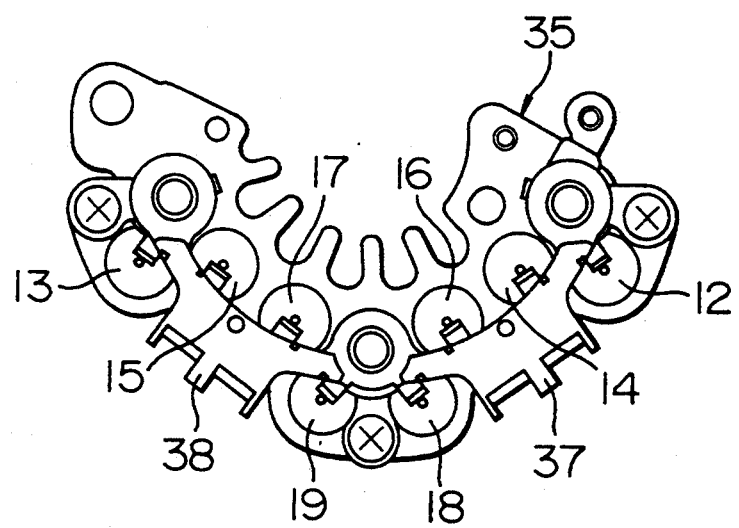
FIG. 4 is a rear view of the cooling plate shown in FIG. 3.

The Zener diodes 12 through 19 are connected to the crescent-shaped cooling plate 35 (see also FIG. 1) shown in FIGS. 3 and 4 of the accompanying drawings. FIG. 3 shows a front surface of the cooling plate 35 and FIG. 4 shows a rear surface thereof. The cooling plate 35 is mounted within a housing of the alternator shown in FIG. 1. Cooling fans 33 are attached to both sides of the rotor 36, and a cooling wind generated when the cooling fans 33 are rotated cools the cooling plate 35 to radiate heat from the Zener diodes 12 through 19.

In FIGS. 3 and 4, reference numerals 37 and 38 depict conventional connecting portions which connect the Zener diodes 12 to 19 and the armature windings 11u, 11v and 11w.

Referring back to FIG. 2, there is provided a semiconductor voltage control apparatus which is shown by a one-dot chain line block 2 in FIG. 2. As shown in FIG. 2, the semiconductor voltage control apparatus 2 includes a power transistor 21 for controlling an exciting current of the exciting winding 10, a power transistor 22 for controlling a charge warning lamp 3 that indicates the charged condition of a battery 5, a controller 23 for controlling the above power transistors 21 and 22, and a fly-wheel diode 24. In FIG. 2, reference numeral 4 depicts a key switch for starting the car, reference numerals 6, 6' depict a plurality of electrical loads and reference numerals 7, 7' depict load switches for these electrical loads 6, 6'.

Figure 5:
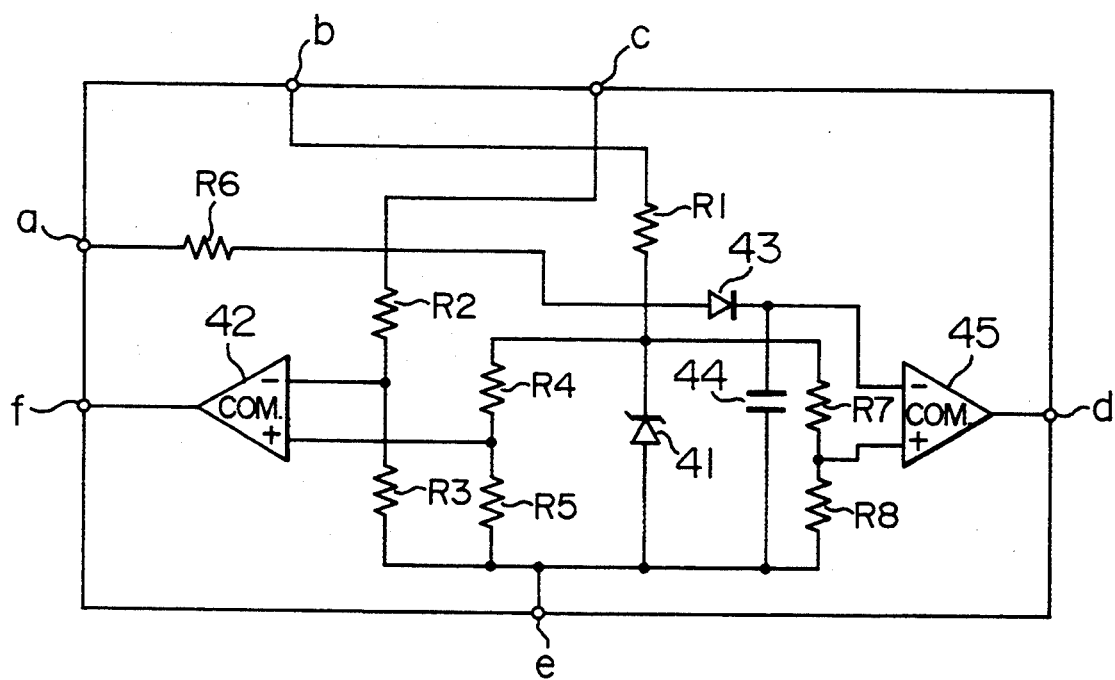
FIG. 5 is a circuit diagram showing a controller 23 of FIG. 2 more in detail.

FIG. 5 of the accompanying drawings is a circuit diagram showing the controller 23 in FIG. 2 more fully. In FIG. 5, reference symbols a through f depict terminals which are connected in association with reference symbols a through f shown in FIG. 2.

Referring to FIG. 5, an output voltage Vb (see FIG. 2) from the rectifier circuit 1 is supplied through a terminal b to a series circuit of a resistor R1 and a Zener diode 41, thereby a constant voltage being generated across the Zener diode 41. A voltage of the battery 5 is supplied through a terminal c to a series circuit of voltage-dividing resistors R2 and R3. A divided voltage from the voltage-dividing resistors R2, R3 is supplied to a negative input terminal of a comparator 42. The constant voltage developed across the Zener diode 41 is divided by voltage-dividing resistors R4 and R5, and a divided voltage is supplied to a positive input terminal of the comparator 42. When the voltage of the battery 5 goes to high level, the voltage input to the negative input terminal of the comparator 42 becomes higher than the voltage input to the positive input terminal thereof so that the comparator 42 produces a low level output. This low level output is supplied through the terminal f to the power transistor 21 (see FIG. 2) and the power transistor 21 is therefore turned off, resulting in the field current of the exciting winding 10 being decreased. Conversely, when the voltage of the battery 5 goes to low level, the comparator 42 produces a high level output and the power transistor 21 is therefore turned on, resulting in the field current of the exciting winding 10 being increased. The controller 23 repeats the above operation to control the battery 5 so that the voltage of the battery 5 is held at the constant value.

A half-wave rectifying voltage from the rectifier circuit 1 is supplied to the terminal a. This voltage applied to the terminal a is supplied through a resistor R6 to a diode 43 and a capacitor 44, in which it is filtered and then fed to a negative input terminal of a comparator 45. The comparator 45 is supplied at its positive input terminal with a divided voltage which results from dividing the constant voltage developed across the Zener diode 41 by voltage-dividing resistors R7, R8. When the alternator is disabled under the condition that the key switch 4 is turned on, the voltage is not supplied to the terminal a so that the output of the comparator 45 goes to high level to turn the power transistor 22 on, thereby energizing the charge warning lamp 3 to represent that the battery 5 is not charged normally. When on the other hand the alternator is driven, the output of the comparator 45 goes to low level to turn the power transistor 22 off, thereby disabling the charge warning lamp 3.

According to the above circuit arrangement, if an output line of the alternator having a voltage Vb is disconnected when the alternator is rotated at high speed, a battery load dump surge as shown in FIG. 14 will occur on the output line of the alternator. As a result, the output of the comparator 42 goes to low level to turn the power transistor 21 off, the exciting current from the exciting winding 10 is kept being flowed through the fly-wheel diode 24. In that case, if ordinary diodes are used as the rectifier cells of the rectifier circuit 1, then the output voltage Vb of the rectifier circuit 1 rapidly rises temporarily. However, according to this embodiment, Zener diodes are used as the rectifier elements so that the output voltage Vb of the rectifier circuit 1 is clamped by a Zener voltage. Therefore, the surge voltage can be prevented from being applied to the semiconductor voltage control apparatus 2 and the electrical loads 6, 6'.

FIG. 6 of the accompanying drawings is a cross-sectional view showing a structure of a Zener diode that is used in the inventive rectifier instrument as the rectifier element. In FIG. 6, reference numeral 50 depicts a Zener diode chip. This Zener diode chip 50 has triple layers fabricated by diffusion of N-type impurity and P-type impurity on a P-type substrate and also has a mesa structure as shown in FIG. 7A of the accompanying drawings. An N+ side of the Zener diode chip 50 is interconnected to a lead 53 by means of a solder 51, and a P+ side thereof is interconnected to a disk 54 by means of a solder 52. The disk 54 is connected to a metal case 56 by means of a solder 55 and the metal casing 56 is connected to the cooling plate 35 (see FIG. 1). The disk 54 is made of a material such as copper (Cu), molybdenum (Mo) or the like. The disk 54 plays a role of a heat sink having a heat capacity sufficient so that heat generated by a large current is flowed to the Zener diode chip 50 is temporarily accumulated and the heat thus accumulated is radiated with time. These chip structure elements are fabricated into the metal case 56 with a sealant 57 made of a material such as silicon or the like, on which a passivation is effected. The Zener diode chip 50 shown in FIG. 7A forms a negative element as shown in FIG. 7B of the accompanying drawings. FIG. 8 of the accompanying drawings shows the case such that the Zener diode chip 50 is formed as a positive element. The structure of this Zener diode chip 50 shown in FIG. 8 is illustrated in FIGS. 9A and 9B of the accompanying drawings. From FIGS. 7A and 9A, it can be understood that the positive element and the negative element are different only in polarity and that they have the same triple-layer structure. Accordingly, the positive element and the negative element can be fabricated via the same process.

Figure 10:
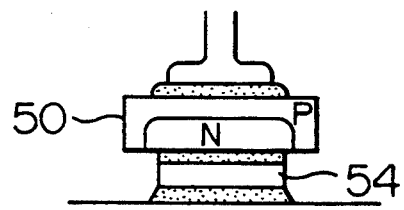
FIGS. 10 and 11 are diagrams showing structures of the prior art, respectively.

Advantages brought about when the Zener diode chip of the present invention is formed as the mesa structure will be described below. When the Zener diode chip is formed as the mesa structure, as shown in FIGS. 6 and 8, the Zener diode chip 50 can be interconnected to the lead 53 or disk 54 by soldering the whole surface of the respective upper and lower surfaces. Therefore, the respective surfaces of the Zener diode chip 50 can be wholly utilized to radiate heat. Hence, the Zener diode chip 50 can be cooled effectively. In addition, since the disk 54 is used as the heat sink, a cooling efficiency can be improved much more. If on the other hand a chip having a planar structure is utilized, as shown in FIG. 10 of the accompanying drawings, although one surface (P-type side) of upper and lower two surfaces of the chip 50 can be wholly soldered, the other surface (N-type side) thereof must be soldered within a limited range of area. Consequently, a sufficient heat radiation area cannot be obtained. Therefore, such Zener diode chip having a planar structure cannot be utilized substantially under severe temperature circumstances in actual practice.

The mesa structure has a uniform shape of its junction plane as compared with the planar structure and has a better Zener characteristic accordingly. Therefore, the mesa structure has a small reverse leakage current.

According to the present invention, there is provided the Zener diode whose chip is formed by diffusion of impurity on the P-type substrate. This Zener diode will hereinafter be referred to as a Zener diode formed from the P-type substrate. Therefore, in the layer structure within the Zener diode chip, as shown in FIGS. 7A and 9A, a distance between a junction portion 47 and an edge portion 48 is relatively large. There is then the small probability that a Zener characteristic will be affected even when the edge portion 48 that tends to be damaged mechanically is damaged. Thus, the Zener diode of the present invention can obtain a satisfactory Zener characteristic as an electric power Zener diode. Hence, the Zener diode of this invention can considerably reduce the reverse leakage current that discharges the charged voltage of the battery.

Figure 11:
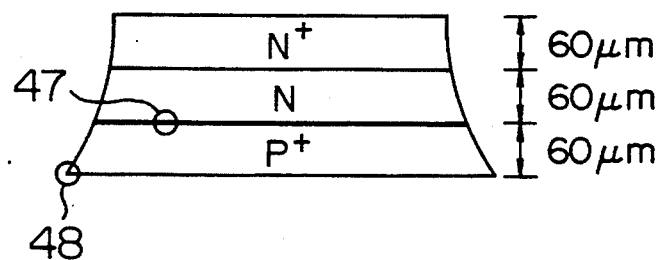
Figure 12:
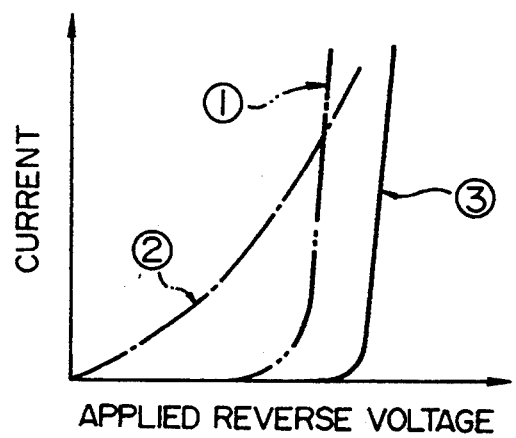
FIG. 12 is a diagram showing characteristic curves obtained when a characteristic of the inventive diode and characteristics of the prior-art diode are compared and, to which references will be made in explaining the present invention.

FIG. 11 of the accompanying drawing shows a structure of a Zener diode whose chip is formed by diffusion of impurity on the N-type substrate. As shown in FIG. 11, the distance between the junction portion 47 and the edge portion 48 is reduced comparatively. Therefore, when the edge portion 48 on which a mechanical stress tends to be concentrated is damaged, a Zener characteristic is unavoidably deteriorated. More specifically, having compared a normal Zener characteristic represented by a solid curve ③ in FIG. 12 of the accompanying drawings with other Zener characteristics, it will be appreciated that the Zener diode chip having the damaged edge portion causes a breakdown at a low voltage as shown by a two-dot chain curve ① or that the above chip tends to generate a leakage current as shown by a one-dot chain curve ②.

When the P-type substrate is used, if both of the P-type substrate and the N-type substrate are the same in resistivity, then a life time of carrier can be reduced by half as compared with the case that the N-type substrate is used. Therefore, a life time of carrier within the chip is reduced with the result that the reverse recovery time is reduced.

When the conventional Zener diodes are used as the rectifier cells, the over-voltage can be suppressed. When, however, the Zener diodes in the three-phase full rectifier circuit are at commutation, two-phase Zener diodes in the three-phase Zener diodes are simultaneously conducted and a short-circuit takes place between the output ends of the two-phase armature windings, resulting in a large current in the rectifier circuit. This large current is a surge current when the Zener diodes are at commutation. A higher harmonic component of the surge current is supplied to the output side of the rectifier circuit and acts as a radio noise to exert a bad influence on electronic devices serving as loads. The surge current generated when the Zener diodes are at commutation is increased more if the reverse recovery time of the Zener diode, i.e, a period of time until the reverse current is progressively attenuated to zero after a voltage applied to the Zener diode has changed from the positive direction to the reverse direction, becomes longer. That is, the longer the reverse recovery time becomes, the surge current generated when the Zener diodes are at commutation is increased much more. Therefore, a radio noise level is increased. Since the inventive Zener diode can reduce the reverse recovery time as mentioned above, the surge current generated when the Zener diodes are at commutation can be reduced and the radio noise level can be lowered accordingly.

The inventive Zener diode has the junction portion formed by diffusion of impurity on the P-type wafer and therefore can be fabricated inexpensively as compared with an epitaxial type Zener diode because the epitaxial type Zener diode needs a relatively long time to grow crystal and becomes expensive. If a life time killer such as platinum (Pt) or gold (Au) injected in order to reduce the reverse recovery time is used, then a material cost and a process cost will be increased much more. Since, however, the inventive Zener diode has the short reverse recovery time as earlier noted, the life time killer is not required. Therefore, the inventive Zener diode can be fabricated inexpensively and becomes economical.

As rectifier cells used in the rectifier circuit that rectifies the output of the vehicle alternator, there are generally utilized avalanche diodes according to the prior art. The avalanche diode and the inventive Zener diode will hereinafter be compared to each other with reference to FIG. 13 of the accompanying drawings. The withstand voltage will be described first. While the avalanche diode has an avalanche breakdown voltage of about 300 Volts, the inventive Zener diode has an avalanche breakdown voltage of about 30 Volts, i.e., substantially one-tenth of the voltage of the avalanche diode. Therefore, according to the inventive Zener diode, it can be avoided that the over-voltage generated at the output side of the rectifier circuit exerts a bad influence upon the electronic device serving as the load. A resistivity within the crystal will be described next. A resistivity of the inventive Zener diode is about 1/200 of that of the avalanche diode and an impurity concentration also can be increased, whereby the reverse recovery time can be reduced to about one-fourth. Thus, the inventive Zener diode can effectively prevent the over-voltage from affecting the load and reduce the radio noise that affects the load.

When the above avalanche diodes are used in the rectifier circuit, if a power supply path to the whole of or part of the electronic device serving as the load is cut by a disconnection or connection failure under the condition such that a revolution rate of the alternator is 10000 r.p.m., then as shown in FIG. 14 of the accompanying drawings, the output voltage of the armature winding rapidly and temporarily rises up to about 140 Volts at first and is then progressively lowered with time due to the fly-wheel diode 24 (see FIG. 2). According to the present invention, as shown in FIG. 15 of the accompanying drawings, the rise of the output voltage of the armature winding is restricted at about 30 Volts owing to the Zener characteristic and then progressively decreased owing to the work of the fly-wheel diode 24 after about 100 milliseconds have passed. Then, by the action of the controller 23, the output voltage of the armature winding is held at about 15 Volts. Hence, the present invention can protect the electronic circuit from the over-voltage generated from the alternator.

The aforesaid reverse recovery time will described. The avalanche diode has a relatively large reverse recovery time $\tau$ as shown in FIG. 16 of the accompanying drawings. Accordingly, the surge current corresponds to a hatched area shown by reference symbol A in FIG. 16. According to the present invention, as shown in FIG. 17 of the accompanying drawings, the reverse recovery time $\tau$ is small and the surge current becomes considerably small as represented by a hatched area B.

The foregoing description will be concluded below with reference to FIG. 18 of the accompanying drawings. As mentioned before, the Zener diode having a mesa structure chip is superior to the Zener diode having a planar structure chip from a rectifier cell cooling effect standpoint. The P-type substrate Zener diode is superior to the N-type substrate Zener diode from a Zener characteristic standpoint, i.e., reverse leakage current standpoint. Study of comparison of the Zener diode having a mesa structure chip with the Zener diode having a planar structure chip reveals, in particular, that the planar structure chip is superior to the mesa structure chip because the planar structure chip is free from the damage of the edge portion and that the planar structure chip is inferior to the mesa structure chip from a Zener characteristic standpoint because the shape of the junction plane of the planar structure chip is not uniform as compared with that of the mesa structure chip. FIG. 18 illustrates the above compared results in the form of a table wherein open circles represent "superior", solid "X's" represent "inferior" and open triangles represent "neither superior nor inferior", respectively. Study of the table of FIG. 18 reveals that the most excellent Zener diode structure is the Zener diode having the mesa structure in which the P-type substrate is employed.

While the inventive Zener diodes are applied to all of the rectifier cells as described above with reference to FIG. 2, the present invention is not limited thereto. If the Zener diode of these Zener diodes 12 through 19 is applied to at least one rectifier cell, then it is possible to achieve the same effects of the present invention. It is, of course, desirable that the inventive Zener diodes are applied to all rectifier cells.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A vehicle alternator output rectifier instrument comprising:
    (a) an alternator for generating power by utilizing a turning force obtained from a vehicle.
    (b) a rectifier circuit comprising a plurality of rectifier elements coupled to the alternator for converting an alternate current output of said alternator to a direct current; and
    (c) a voltage control apparatus coupled to the rectifier circuit for controlling a direct current output voltage from said rectifier circuit, wherein:
    at least one of said rectifier elements of said rectifier circuit is a Zener diode having a Zener breakdown voltage in a reverse biased direction thereof, whereby an output of said rectifier circuit is limited to a maximum voltage equal to said Zener voltage;
    said Zener diode has a mesa structure; and
    said Zener diode is thermally coupled to a heat sink connected to a metal case of said Zener diode, for temporarily accumulating heat generated by a temporary large current flowing through said Zener diode.

2. The vehicle alternator output rectifier instrument according to claim 1, wherein said rectifier element includes a chip fabricated by diffusion of impurity on a P-type substrate.

3. The vehicle alternator output rectifier instrument according to claim 1, wherein said rectifier element includes a chip fabricated without injection of a life time killer.

4. The vehicle alternator output rectifier instrument according to claim 2, wherein said chip is fabricated without injection of a life time killer.

* * * * *